(12) United States Patent
Keough

(10) Patent No.: US 9,476,645 B2
(45) Date of Patent: Oct. 25, 2016

(54) OPEN BOTTOM ELECTRIC INDUCTION COLD CRUCIBLE FOR USE IN ELECTROMAGNETIC CASTING OF INGOTS

(75) Inventor: Graham A. Keough, Hainesport, NJ (US)

(73) Assignee: CONSARC CORPORATION, Rancocas, NJ (US)

(*) Notice: Subject to any disclaimer, the term of this patent is extended or adjusted under 35 U.S.C. 154(b) by 995 days.

(21) Appl. No.: 13/414,231

(22) Filed: Mar. 7, 2012

(65) Prior Publication Data
US 2012/0236898 A1    Sep. 20, 2012

Related U.S. Application Data

(60) Provisional application No. 61/452,408, filed on Mar. 14, 2011.

(51) Int. Cl.
| | |
|---|---|
| F27D 3/00 | (2006.01) |
| F27B 14/06 | (2006.01) |
| F27B 14/10 | (2006.01) |
| F27B 14/14 | (2006.01) |
| B22D 11/00 | (2006.01) |
| B22D 11/115 | (2006.01) |
| B22D 11/14 | (2006.01) |
| B22D 23/06 | (2006.01) |
| B22D 27/02 | (2006.01) |
| C30B 29/06 | (2006.01) |
| C30B 11/00 | (2006.01) |

(52) U.S. Cl.
CPC ............ *F27B 14/061* (2013.01); *B22D 11/001* (2013.01); *B22D 11/115* (2013.01); *B22D 11/141* (2013.01); *B22D 23/06* (2013.01); *B22D 27/02* (2013.01); *C30B 11/001* (2013.01); *C30B 11/002* (2013.01); *C30B 11/003* (2013.01); *C30B 29/06* (2013.01); *F27B 14/10* (2013.01); *F27B 14/14* (2013.01)

(58) Field of Classification Search
CPC ...... F27B 14/00; F27B 14/06; F27B 14/061; F27B 14/065; F27B 14/08; F27B 14/0806; F27B 14/10; F27B 2014/0837; F27B 2014/0868; F27B 2014/108; H05B 6/24
USPC .......... 373/138, 142, 151–158; 264/402, 403
See application file for complete search history.

(56) References Cited

U.S. PATENT DOCUMENTS

| | | | |
|---|---|---|---|
| 3,598,168 A | 8/1971 | Clark | |
| 4,572,812 A | 2/1986 | Ciszek | |
| 4,600,426 A * | 7/1986 | Schwenninger | ................ 65/330 |
| 5,283,805 A * | 2/1994 | Kawano et al. | ............... 373/156 |

(Continued)

FOREIGN PATENT DOCUMENTS

| | | |
|---|---|---|
| CN | 2551373 Y | 5/2003 |
| CN | 101829767 A | 9/2010 |
| JP | 1094861 A | 4/1998 |

(Continued)

*Primary Examiner* — Dana Ross
*Assistant Examiner* — Brandon Harvey
(74) *Attorney, Agent, or Firm* — Philip O. Post

(57) ABSTRACT

An open bottom electric induction cold crucible with a slotted wall extending below one or more induction coils surrounding the partial exterior height of the crucible is used in an electromagnetic casting process for the production of ingots. A bottom magnetic shield is provided around the outer perimeter of the crucible's slotted wall in the vicinity of the bottom opening and the bottom termination of the wall slots and the bottom connecting member.

13 Claims, 9 Drawing Sheets

(56) References Cited

U.S. PATENT DOCUMENTS

| | | | |
|---|---|---|---|
| 6,436,336 B1* | 8/2002 | Knudsen et al. | 266/201 |
| 6,695,035 B2* | 2/2004 | Kimura et al. | 164/507 |
| 7,000,678 B1 | 2/2006 | Mon et al. | |
| 2008/0179037 A1* | 7/2008 | Yoshihara et al. | 164/460 |
| 2009/0129429 A1* | 5/2009 | Fishman | 373/146 |

FOREIGN PATENT DOCUMENTS

| | | |
|---|---|---|
| JP | 2008188632 A | 8/2008 |
| JP | 2008-279501 A | 11/2008 |
| JP | 2010-017749 A | 1/2010 |
| JP | 2010017749 A * | 1/2010 |
| KR | 10-2006-0016659 A | 2/2006 |

* cited by examiner

OPEN BOTTOM ELECTRIC INDUCTION COLD CRUCIBLE FOR USE IN ELECTROMAGNETIC CASTING OF INGOTS

CROSS REFERENCE TO RELATED APPLICATIONS

This application claims the benefit of U.S. Provisional Application No. 61/452,408 filed Mar. 14, 2011, hereby incorporated herein by reference in its entirety.

FIELD OF THE INVENTION

The present invention relates to electromagnetic casting of ingots where an open bottom electric induction cold crucible is used in the casting process.

BACKGROUND OF THE INVENTION

An ingot can be cast by heating and melting a charge of material deposited in an open bottom electric induction cold crucible. Charge, for example in the form of raw or processed ore, can be fed into the crucible to maintain a molten mass (melt) of the material in the crucible as a portion of the molten mass solidifies and exits the bottom opening of the crucible as a formed ingot. The material must be electrically conductive in at least the molten (liquid) state for this electromagnetic casting process. Melting and heating of the charge can result in purification of the charge, for example, by impurities evaporating from the melt, or rising through the melt to float as dross at the surface of the melt within the crucible.

As mentioned above, the material does not necessarily need to be electrically conductive in the solid state. For example in a silicon electromagnetic casting process, room temperature solid non-electrically conductive silicon charge may be fed into the top of the crucible after a molten mass of electrically conductive silicon has been established within the crucible. U.S. Pat. No. 4,572,812 titled "Method and Apparatus for Casting Conductive and Semiconductive Materials" discloses a basic continuous silicon electromagnetic casting process, and is incorporated herein by reference in its entirety.

U.S. Pat. No. 4,572,812 (referred to as "the '812 patent") discloses an electromagnetic casting process utilizing a single induction heating coil surrounding the exterior slotted wall (formed from a plurality of vertical members) of an open bottom electric induction cold crucible with the induction coil being connected at its terminals to a single RF power source.

The open bottom cold crucible may be installed in an enclosed chamber so that the heating, melting and/or solidification processes are accomplished in a vacuum or process gas environment. Further suitable cooling apparatus may thermally interact with the ingot as it exits the crucible so that the ingot's cooling rate over time is controlled until it reaches ambient temperature.

In other electromagnetic casting processes, two or more induction coils may be utilized in a stacked (adjacent) configuration around a partial exterior height of the crucible. For example, as shown in FIG. 1(a), FIG. 1(b) and FIG. 1(c), open bottom electric induction cold crucible 100 comprises a slotted wall formed from a plurality of vertical members 112 separated from each other by vertical slots 114 (shown as solid lines in the figures), with two separate induction coils 116a and 116b surrounding a partial exterior height of the crucible. The vertical slotted members are formed from a suitable material such as copper in this example, and may be connected at the top and bottom of the crucible. The connection between slotted members at the top of the crucible is almost always used and often provides the connection between each member and a water cooling circuit. The top connection is normally a significant distance from the melt and hence does not materially affect the induction coupling to the load of material in the crucible. The bottom connection, on the other hand, is not always used for smaller size crucibles but is more commonly used for larger crucibles where the connection provides support to the bottom of each vertical slotted member. In an electromagnetic casting process, the crucible slots are at least sufficiently long to support the inductive heating of the melt within the crucible and facilitate gradual cooling of the ingot as it is created at the solidification boundary 120 (as diagrammatically illustrated in FIG. 1(c)) until it exits the bottom of the crucible. It is the finding of this invention that, where the slots between vertical members do not extend to the bottom of the crucible (terminating at slot end 114a in FIG. 1 (c)), and hence a bottom copper (in this example) connecting member (horizontal) 117 is formed, the electromagnetic field generated by alternating current flow in induction coil 116b will tend to induce a circulating current which is very close to the load (ingot) as it exits the crucible. This proximity of the circulating currents generates heat in the load at a critical location where it may increase the risk of a run-out event that occurs when liquid silicon manages to find a way to the outer edge of the normally solidified edge of the cast ingot as it is drawn out of the crucible. The liquid silicon then flows in an uncontrolled manner into the bottom part of the furnace enclosure to cause damage to ancillary heaters, insulators and mechanical parts. Each of the coils may be connected to a separate alternating current (AC) power source operating at a different frequency. For example upper coil 116a may be operating at a frequency that is less than the frequency of the lower coil 116b. Flow of alternating current in each coil establishes a magnetic flux field that penetrates the slots (filled with an electrical insulating material) of the crucible to electromagnetically heat and melt an electrically conductive material placed within the interior crucible volume. As with all electric induction cold crucibles, the plurality of vertically members 112 making up the crucible's wall are cooled (typically by internally circulated water) so that the molten mass in contact with the wall freezes. This prevents contamination of the molten mass with wall material. The upper regions of the molten mass are at least partially supported by the Lorentz forces generated by the interaction of the magnetic field produced by the induction coils and the induced currents in the melt, to form a region of reduced contact pressure, or even separation, between the wall and the liquid mass of metal.

The advantage of multiple coils operating at different frequencies is the ability to lower the magnitude of the terminal voltage across each induction coil while still achieving a high level of induced energy transfer to the material within the crucible. This is of particular advantage when the electromagnetic casting process is performed with an oxidation prevention cover agent within the interior of the crucible that prevents oxidation of the molten material, as is the case in some silicon electromagnetic casting processes. Lower terminal voltages mitigate an arcing phenomenon between the melt and wall in the separation region mentioned above that can result in localized melting of the vertical members making up the crucible wall and migration of impurities from theses vertical members into the molten material within the crucible. The higher the terminal voltage across each coil the greater the risk of an arc. This is most significant when the interior cross sectional area of the crucible is sufficiently large to require a high coil terminal voltage to deliver sufficient induced energy to the melt in the crucible. In general when the interior cross sectional area of the crucible exceeds approximately 180 square inches, multiple coils operating at different frequencies are beneficial since this arrangement allows coil terminal voltages at less than 600 volts while an equivalent magnitude of induced energy can be transferred to the melt as would be done with a coil operating with a terminal voltage of 600 volts or more, and thus avoiding the melt contamination problem from arcing as described above.

The height of the open bottom electric induction cold crucible extends a distance, $h_1$, below the lower end of lower induction coil 116b. Generally the vertical members 112 making up the wall of the crucible are sloped (tapered) outwards towards the open bottom of the crucible to facilitate movement of the formed ingot out of the crucible. In the two-coil arrangement shown in FIG. 1(a), the outward tapering may begin between the adjacent terminations of the upper and lower induction coils, to establish a taper distance of $h_2$.

In some electromagnetic casting arrangements, an intercoil magnetic shield 118 can be positioned between the adjacent ends of coils 116a and 116b to prevent mutual magnetic coupling (and interference) between the magnetic flux established by current flow in each of the two coils. Typical resulting magnetic flux patterns are represented by dashed lines in FIG. 1(a). Magnetic flux 116a' is established by alternating current flow through upper coil 116a and magnetic flux 116b' is established by alternating current flow through lower coil 116b. Magnetic flux field 116b' extends below the bottom opening of the crucible. Such an arrangement results in anomalies around the outer perimeter of the formed ingot exiting the bottom of the crucible. The portion of the electromagnetic induction field which encompasses the bottom copper connecting member (horizontal) 117 of the crucible induces a circulating current which causes local heating of the surface of the load due to the fact that at the relatively high temperature the solid silicon is still partially conductive. This can cause a local change in the solidification temperature gradient which will increase stresses in the load and may increase the risk of run-outs (which would end the process and damage the equipment).

FIG. 1(d) illustrates the anomalies by a partial cross sectional thermal diagram near the bottom of the crucible. The dashed lines represent boundaries (contours) for typical temperature ranges in a silicon ingot being cast. The indicated range of numbers, for example, "20-19 kiloWatts (kW) per cubic meter ($m^3$)" indicates a range of 20 to 19 kiloWatts per cubic meter of (volumetric) ohmic losses within the representative cross sectional contour in the silicon ingot being cast. Magnitude of ohmic losses within a region is representative of the temperature in the region. The adverse effect of local heating is demonstrated in the contours (region emphasized in single cross hatch) illustrating a relatively intense heating effect (ohmic loss) in the cast silicon adjacent to the bottom connecting member (horizontal) 117 and around that region a further contour of less intense heating (emphasized in double cross hatch).

It is one object of the present invention to eliminate the anomalies occurring around the bottom opening of an open bottom electric induction cold crucible used in an electromagnetic casting furnace that is caused by magnetic flux extension in the region of the bottom copper connecting member (horizontal) of the crucible.

BRIEF SUMMARY OF THE INVENTION

In one aspect, the invention is apparatus for, and method of, induction heating and melting of a material in an open bottom electric induction cold crucible used in an electromagnetic casting process. The open bottom electric induction cold crucible includes a bottom magnetic shield in the vicinity of the lower ends of the slots in the wall, the bottom copper connecting member (horizontal) of the crucible, and the open bottom of the crucible.

In another aspect, the invention is an open bottom electric induction cold crucible for electromagnetic casting. The crucible has a crucible volume into which a charge can be fed for electric induction heating and melting. The melt at least partially solidifies within the crucible volume to form an ingot that exits from the open bottom of the crucible. The crucible volume is formed from an electrically conductive, water-cooled and slot-segmented wall. The slot-segmented wall interfaces with a non-slotted perimeter wall region at the open bottom of the cold crucible and one or more induction coils surround a portion of the exterior height of the crucible volume to inductively heat and melt the charge in the crucible volume. A bottom electrically conductive magnetic shield is disposed around the outer perimeter of the slot-segmented wall in a crucible bottom region adjacent to the continuous, electrically conductive and non-slotted perimeter wall region.

In another aspect the present invention is a method of electromagnetic casting an ingot in an open bottom electric induction cold crucible. A charge of pre-ingot material is supplied to a crucible volume formed from an electrically conductive, water-cooled and slot-segmented wall having a continuous, electrically conductive and non-slotted perimeter wall region at the open bottom of the open bottom electric induction cold crucible. A magnetic flux field is generated exterior to the slot-segmented wall around a portion of the height of the slot-segmented wall. The magnetic flux field penetrates into the crucible volume to inductively heat and melt the charge of pre-ingot material within the crucible volume to form a molten pre-ingot composition within the crucible volume. The molten pre-ingot composition is at least partially solidified within the crucible volume to form the ingot at the open bottom of the open bottom electric induction cold crucible. The magnetic flux field is suppressed from penetrating into the slot-segmented wall adjacent to the non-slotted perimeter wall region.

Other aspects of the invention are set forth in this specification and the appended claims.

BRIEF DESCRIPTION OF THE DRAWINGS

For the purpose of illustrating the invention, there is shown in the drawings a form that is presently preferred; it being understood, however, that this invention is not limited to the precise arrangements and instrumentalities shown.

DETAILED DESCRIPTION OF THE INVENTION

When used herein the term "electrically conductive material" includes materials that are not necessarily electrically conductive in the solid state, but are electrically conductive in the molten state, such as silicon based compositions with varying degrees of purities.

Figure 2:
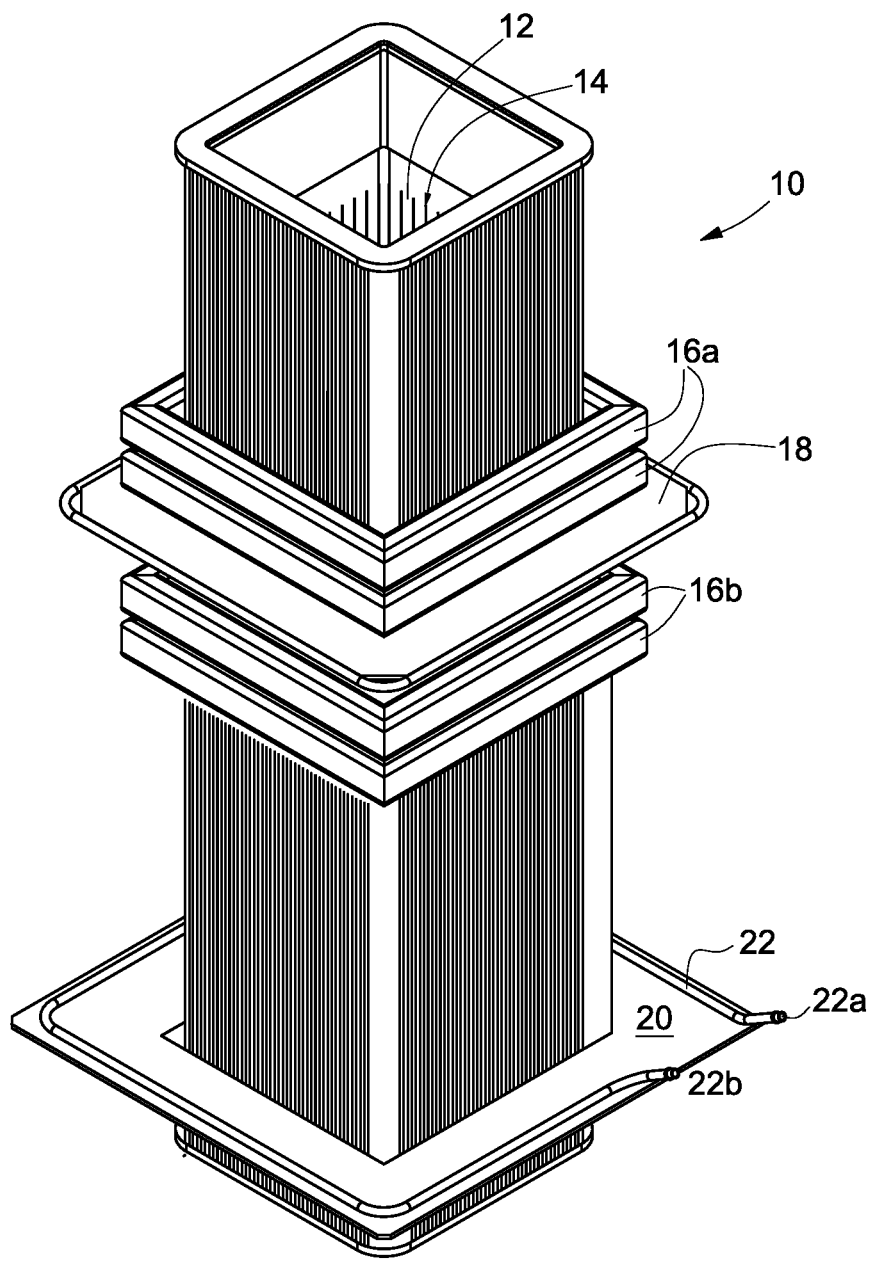
FIG. 2 is an isometric view of one example of an open bottom electric induction cold crucible of the present invention for use in an electromagnetic casting process.
Figure 3:
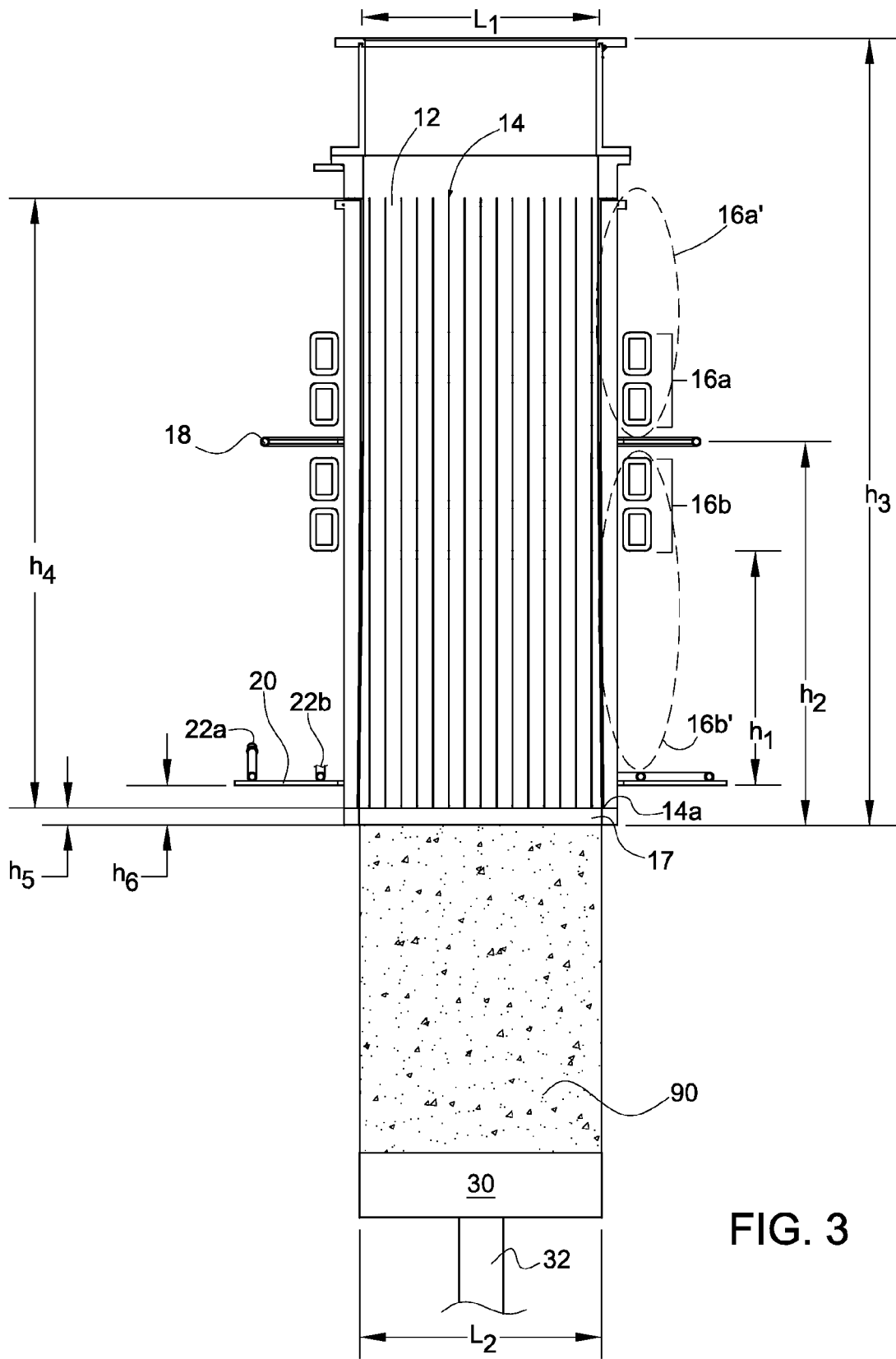
FIG. 3 is a simplified cross sectional side elevational view of the open bottom electric induction cold crucible shown in FIG. 2 with a formed ingot exiting the bottom of the crucible.
Figure 4:
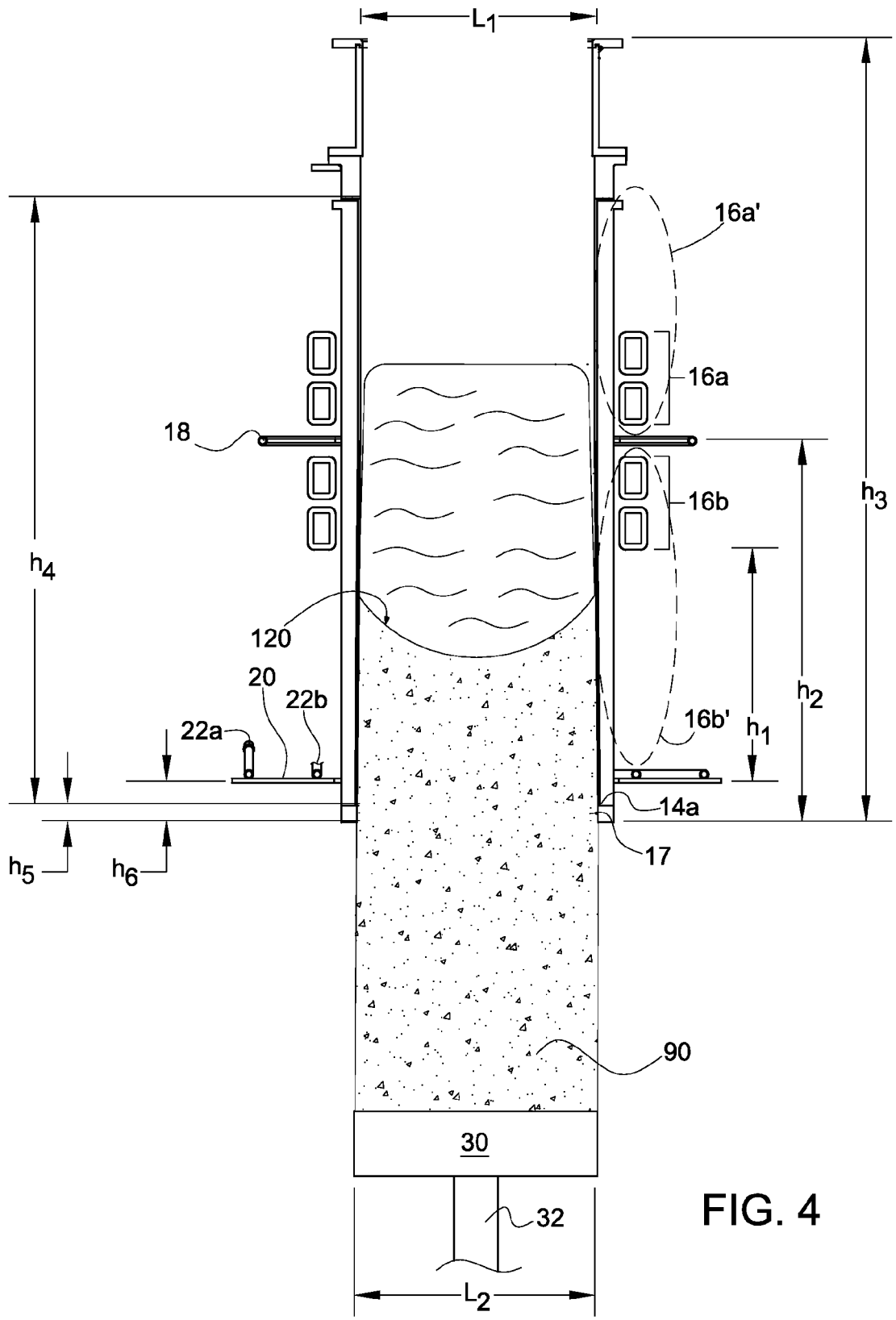
FIG. 4 is a simplified cross sectional side elevational view of the open bottom electric induction cold crucible shown in FIG. 2 with a typical magnetic flux field pattern illustrated when the induction coils are supplied with AC power.

There is shown in FIG. 2 through FIG. 4 one example of an open bottom electric induction cold crucible 10 of the present invention for use in an electromagnetic casting process. In the particular example shown in the figures, a two-coil arrangement is used.

In one example of the present invention, the open bottom electric induction cold crucible has an overall height, $h_3$, of 37⅛ inches and comprises 60 water-cooled vertical members 12 (slotted wall segments) arranged to form a square-shaped interior volume with a top side length, $L_1$, of 13¾ inches; a tapered bottom side length, $L_2$, of 14 inches; and a tapered height, $h_2$, of 13½ inches beginning at inter-coil magnetic shield 18 and extending to the bottom of the crucible as shown in FIG. 3. Overall height, $h_4$, of the electrically insulated slots 14 is 26¾ inches with the bottoms of the slots terminating at a distance, $h_5$, of 1 inch from the bottom of the crucible as shown in FIG. 3. The bottoms 14a of the slots terminate at the bottom connecting member 17. The slot-segmented wall and bottom connecting member are formed from a suitable electrically conductive material.

Figure 5A:
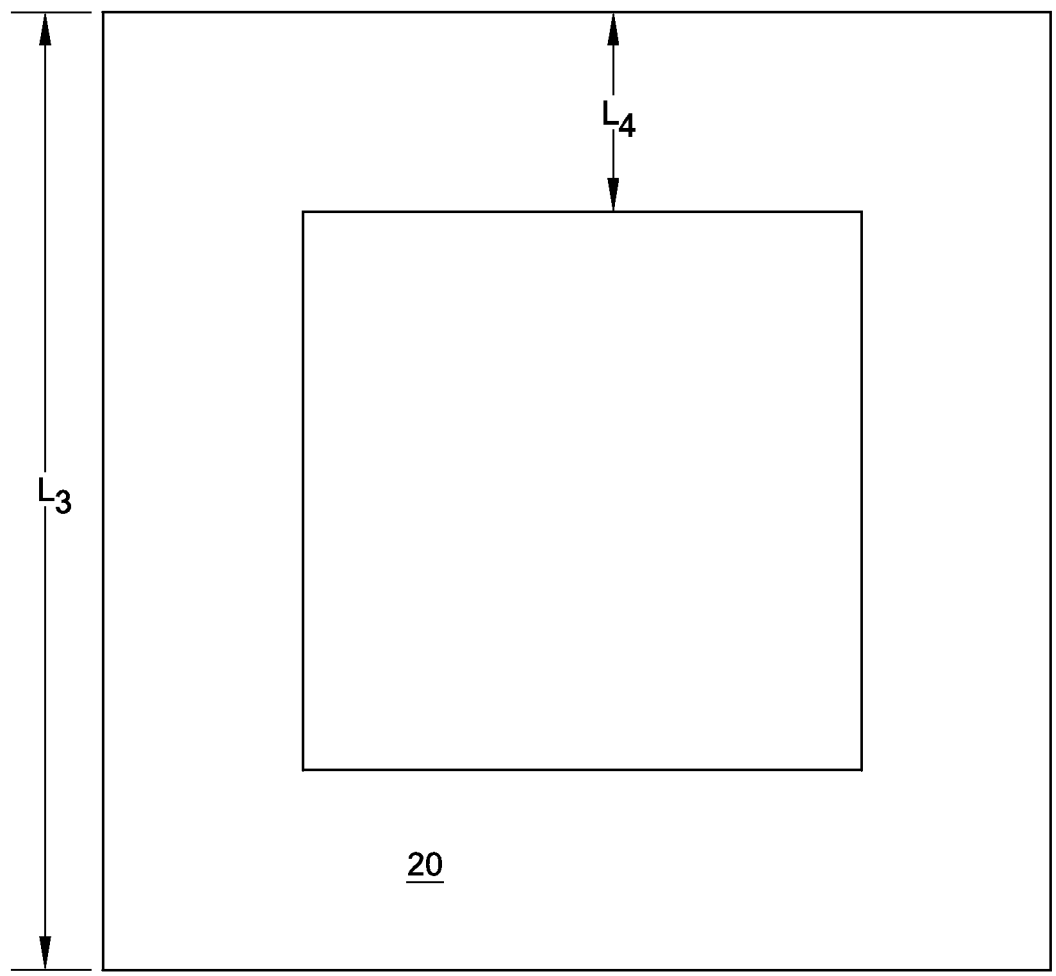
FIG. 5(a) and FIG. 5(b) are top plan and side views of one example of a bottom magnetic shield that can be used in one example of the present invention.
Figure 5B:
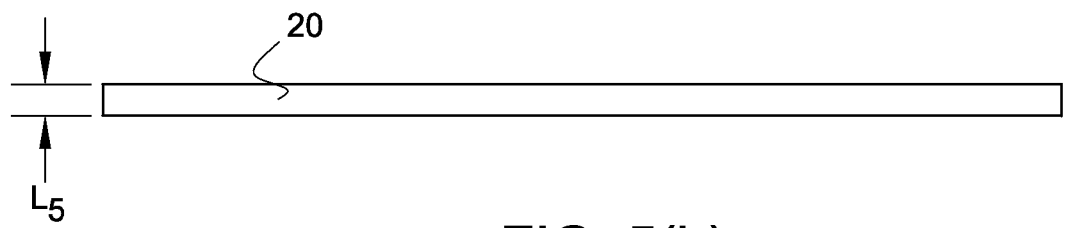

Bottom magnetic shield 20 in this example of the invention comprises a copper rectangularly-shaped flattened annulus having a side length, $L_3$, of 16¾ inches; an annulus width, $L_4$, of 6 inches; and a thickness, $L_5$, of ¼ inches as shown in FIG. 5(a) and FIG. 5(b). The bottom magnetic shield is installed at a height, $h_6$, of 2½ inches from the bottom of the crucible so that the bottom magnetic shield is positioned approximately 1½ inches above the bottom slot termination with the bottom connecting member. That is, it is disposed around the outer perimeter of the slot-segmented wall in a crucible bottom region adjacent to the bottom connection member that can also be described as a continuous, electrically conductive and non-slotted perimeter wall region.

The bottom magnetic shield described above is one example of a suitable magnetic shield. In the present invention, the bottom magnetic shield can be formed in any configuration that will conduct an induced current in a location outside the crucible such that the bottom copper connecting member (horizontal) is not subjected to the induction field and hence does not conduct a current in close proximity to the load thus mitigating the adverse heating effects which would otherwise occur. The bottom magnetic shield suppresses the magnetic flux field 16b' from penetration into the slotted wall adjacent to the continuous, electrically conductive and non-slotted perimeter wall region (bottom connection member 17). The bottom magnetic shield may be cooled, for example, by circulating a cooling medium through passages either within or attached to the bottom magnetic shield, such as conduit 22 with suitable supply and return terminations 22a and 22b for connection to the cooling medium circulation apparatus.

One application of crucible 10 of the present invention is in a silicon electromagnetic casting process where the crucible is installed in an optional sealable electromagnetic casting furnace vessel operating in an inert atmosphere. Induction coils 16a and 16b are installed externally around the crucible volume with inter-coil magnetic shield 18 positioned between the coils inside of the sealed furnace vessel, with the two coils arranged in a stacked (adjacent) configuration around a portion of the height of the crucible. A suitable charge supply apparatus can be used to feed solid silicon charge into the open top of the crucible within the sealed vessel. The non-electrically conductive solid charge can be initially heated and melted by auxiliary heating apparatus and methods as known in the art until sufficient electrically conductive molten silicon is formed within the crucible so that alternating current flow through the induction coils can further inductively heat the melt and additional solid charge can be supplied to the melt as the length of ingot 90 exiting the crucible grows. A temperature control apparatus can be utilized at the bottom exit of the crucible (either within or external to the sealed furnace vessel) to control the temperature of the ingot as it further solidifies. Ingot 90 is supported on ingot support member 30 as it is drawn from the crucible and sealed furnace vessel. Support member 30 may be formed from graphite and used as a heating element in the heating and melting of the initial solid silicon charge in the furnace. Vertical retracting apparatus 32 is attached to the bottom of support member 30 to control the vertical drop rate of the ingot from the bottom of the crucible.

Once an initial charge of solid silicon has been melted in the crucible by auxiliary heating apparatus, induced energy to the melt can be provided by increasing the induced power output from the upper induction coil 16a up to approximately 750 kW at 15 kHz by applying a voltage across the terminals of the upper coil. Subsequently, or in combination therewith, further induced energy to the melt can be provided by increasing the induced power output from the lower induction coil 16b up to approximately 300 kW at 35 kHz by applying a voltage across the terminals of the lower coil. The applied terminal voltage to the upper induction coil 16a was approximately 600 volts maximum and the applied terminal voltage to the lower induction coil 16b was approximately 600 volts maximum to achieve the above mentioned inductive energy outputs, thus limiting the terminal voltages to approximately less than 600 volts, respectively, to avoid the melt contamination problem mentioned above.

Figure 1A:
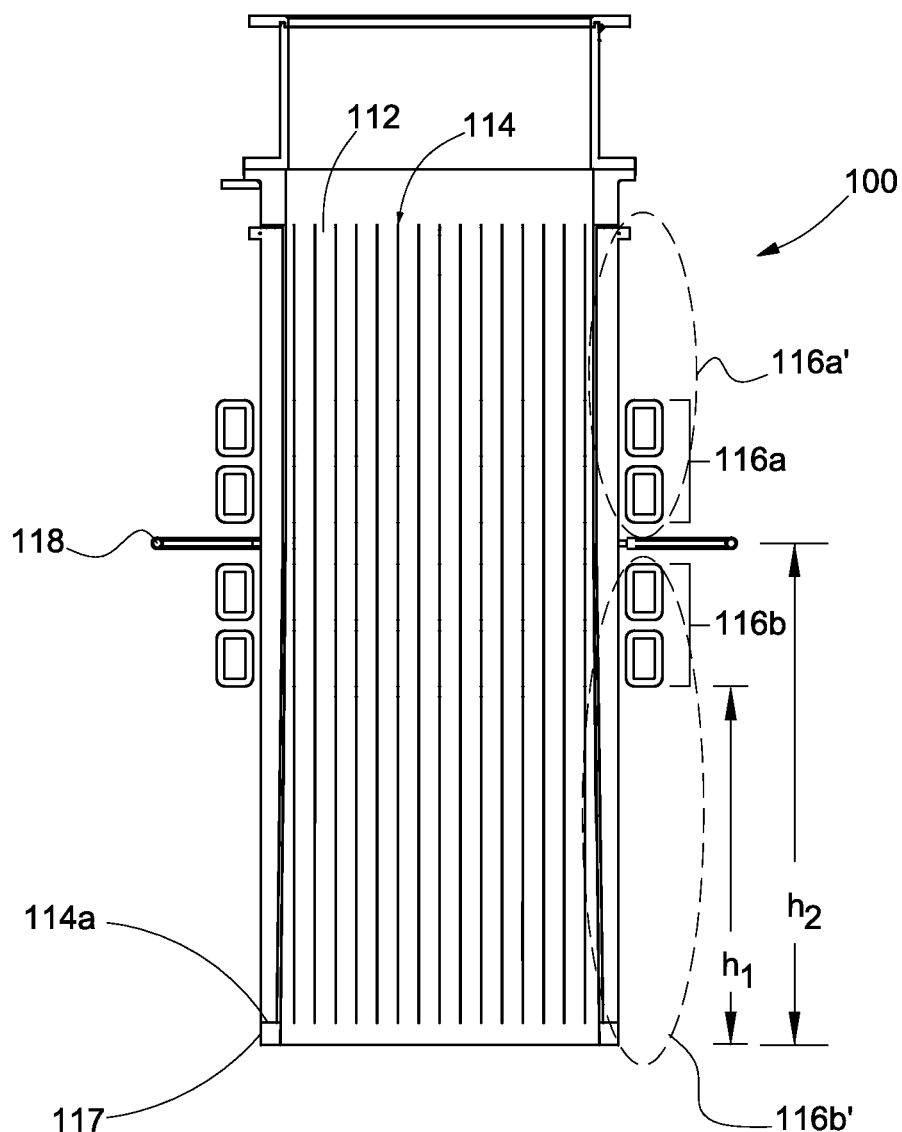
FIG. 1(a) is a simplified cross sectional side elevational view of an open bottom electric induction cold crucible that can be used in an electromagnetic casting process.
Figure 1B:
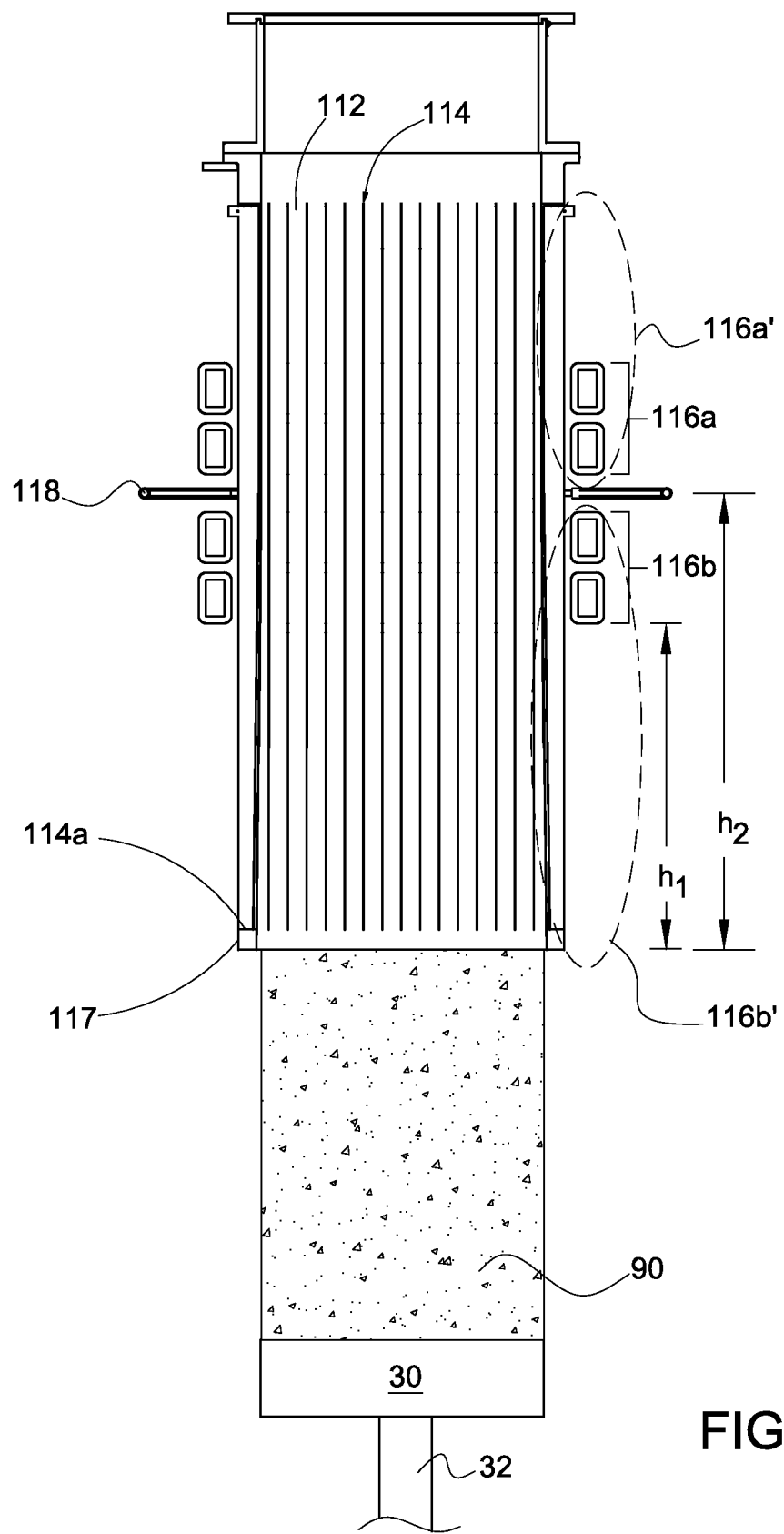
FIG. 1(b) is a simplified cross sectional side elevational view of the open bottom electric induction cold crucible shown in FIG. 1(a) with a formed ingot exiting the bottom of the crucible.
Figure 1C:
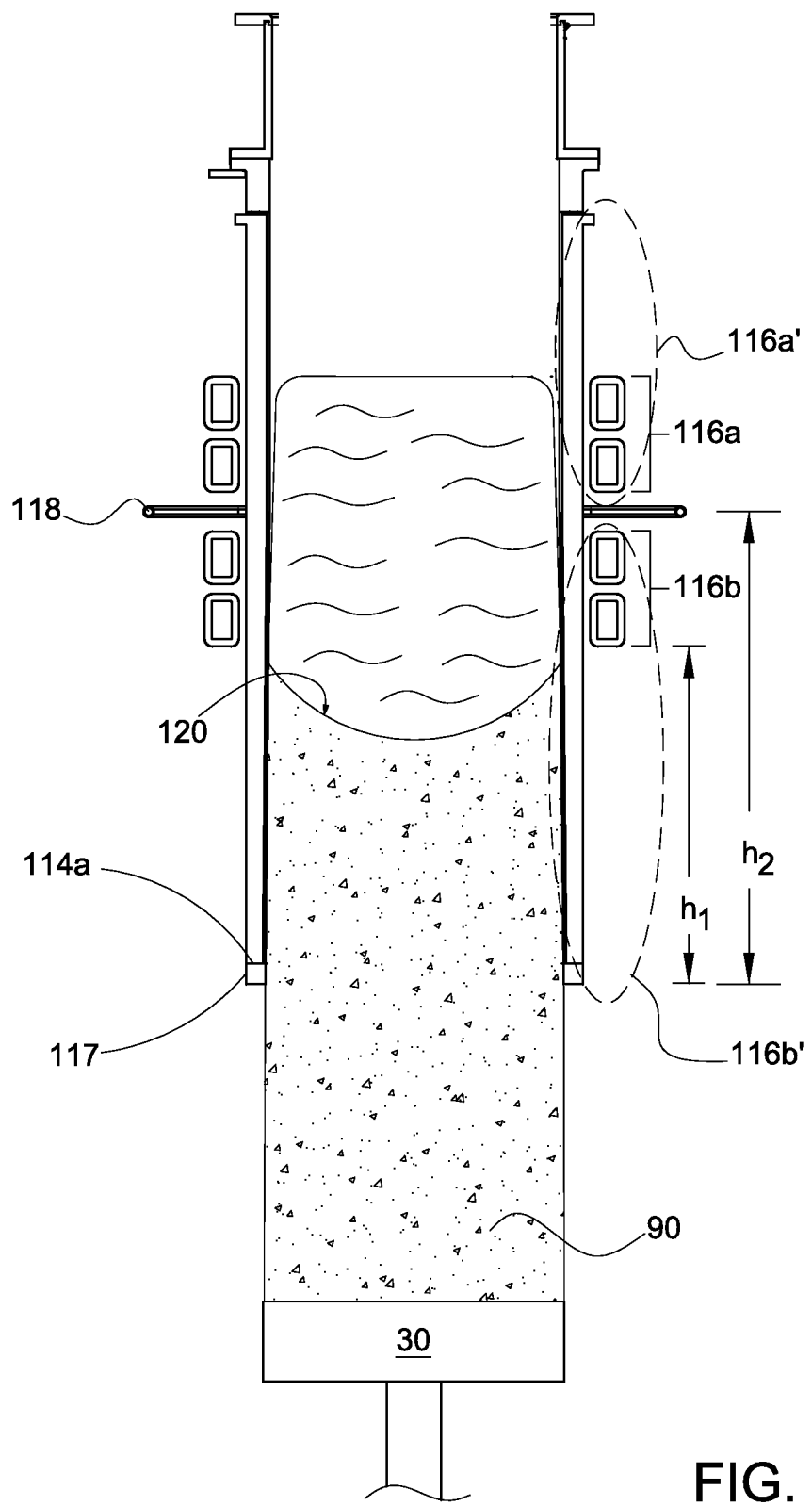
FIG. 1(c) is a simplified cross sectional side elevational view of the open bottom electric induction cold crucible shown in FIG. 1(b) with exemplary molten and solidified masses shown within the crucible during an electromagnetic casting process.
Figure 1D:
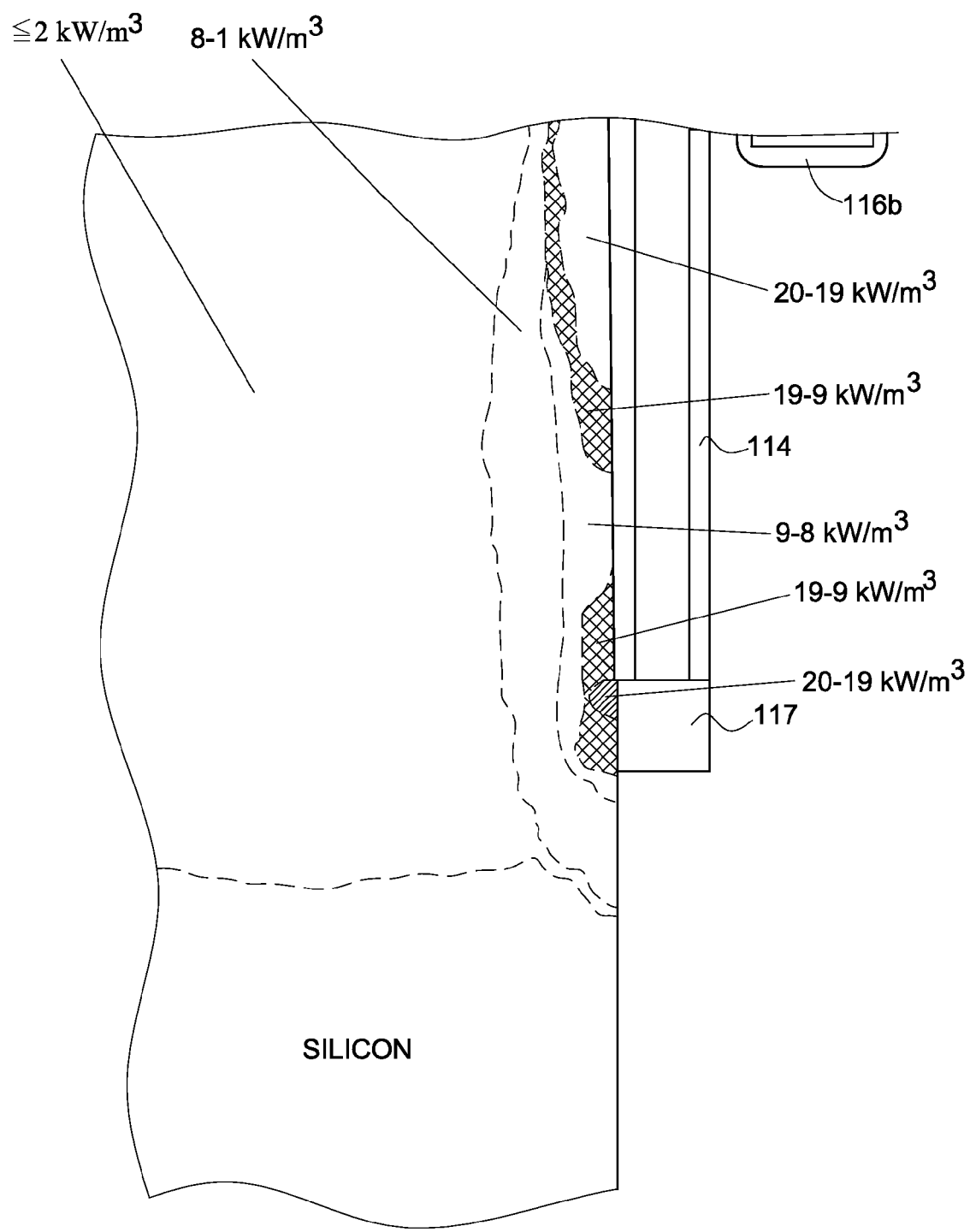
FIG. 1(d) is a partial cross sectional detailed view of the anomalies that occur at the open bottom of the electric induction cold crucible shown in FIG. 1(a) due to the extension of magnetic flux below the bottom opening of the crucible that has a bottom horizontal connecting member around the circumference of the crucible.
Figure 6:
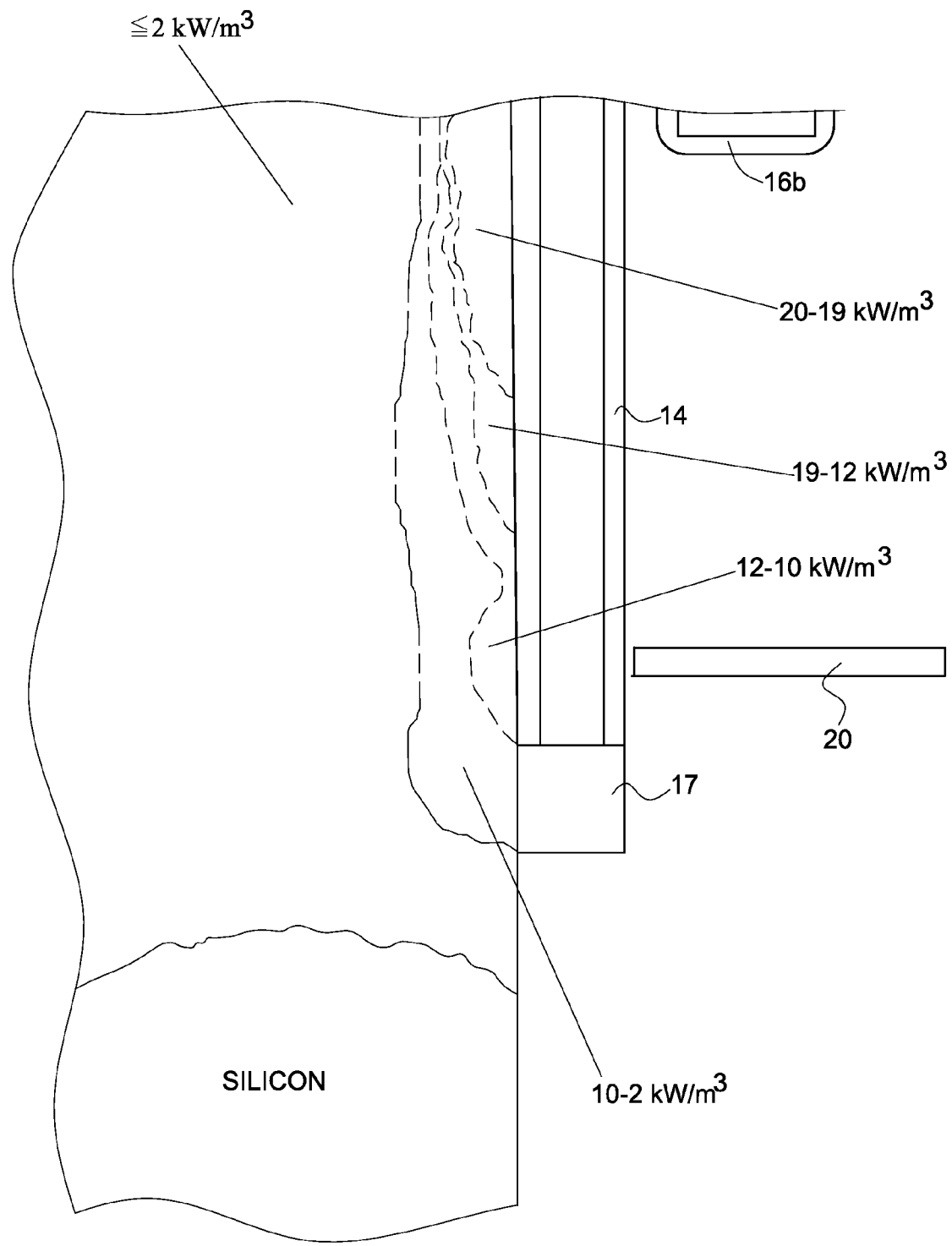
FIG. 6 is a partial cross sectional detailed view of an open bottom electric induction cold crucible of the present invention with a bottom magnetic shield that eliminates the anomalies shown in FIG. 1(d).

FIG. 6 illustrates the typical advantage of the present invention in a partial cross sectional thermal diagram near the bottom of the crucible. Comparing FIG. 6 with a bottom magnetic shield 20 placed outside the crucible as in the present invention with FIG. 1(d) where a bottom magnetic shield is not used, at the same current in the coil(s) as that for the example for FIG. 1(d), the bottom connecting member (horizontal) 17 is shielded from the effect of the induction field and the dashed line contours show that the adverse heating effects are mitigated by use of the bottom magnetic shield in the present invention.

The above silicon electromagnetic casting process of the present invention can be used with compositions other than silicon with suitable selection of a pre-ingot charge material resulting in a molten pre-ingot composition from which the ingot is formed.

While a two-coil open bottom electric induction cold crucible is illustrated in the above examples of the invention, the invention may be applied to crucibles with a single coil or other than two multiple coils surrounding the exterior of the crucible by locating the bottom magnetic shield relative to the location of the lowest coil, the lower ends of the slots 14a and the bottom opening as described above for the two-coil arrangement.

While the above examples of the invention describe a crucible with an interior crucible volume having a square cross section, the present invention applies to other configurations, such as an interior crucible volume having a circular cross section.

When used herein the term "continuous electromagnetic casting process" includes intermittent electromagnetic casting where, for example, the casting process stops after a manufactured ingot of a desired height exits the bottom of the crucible so that the manufactured ingot can be relocated before the casting process continues to produce another ingot.

While preferred embodiments of the invention have been described and illustrated above, it should be understood that these are exemplary of the invention and are not to be considered as limiting. Additions, omissions, substitution, and other modifications can be made without departing from the scope of the present invention. Accordingly, the invention is not to be considered as being limited by the foregoing description.

The invention claimed is:

1. An open bottom electric induction cold crucible for electromagnetic casting, the open bottom electric induction cold crucible comprising:
    a crucible volume into which a charge can be fed for inductive heating and melting, and subsequent solidification within the crucible volume to form an ingot at an open bottom of the open bottom electric induction cold crucible, the crucible volume formed from an electrically conductive, water-cooled and slot-segmented wall, the electrically conductive, water-cooled and slot-segmented wall having a continuous, electrically conductive and non-slotted perimeter wall region at the open bottom of the open bottom electric induction cold crucible;
    an upper and a lower induction coil arranged adjacent to each other and surrounding a portion of the height of the crucible volume to inductively heat and melt the charge in the crucible volume when an alternating current flows through the upper and the lower induction coils, the upper and the lower induction coils being separated from each other by an inter-coil magnetic shield; and
    a bottom electrically conductive magnetic shield disposed around the outer perimeter of the electrically conductive, water-cooled and slot-segmented wall in a crucible bottom region adjacent to the continuous, electrically conductive and non-slotted perimeter wall region.

2. The open bottom electric induction cold crucible according to claim 1 wherein the bottom electrically conductive magnetic shield comprises a copper rectangularly-shaped flattened annulus.

3. The open bottom electric induction cold crucible according to claim 1 wherein the bottom electrically conductive magnetic shield is water cooled.

4. A method of electromagnetic casting an ingot in an open bottom electric induction cold crucible, the method comprising the steps of:
    supplying a charge of a pre-ingot material to a crucible volume formed from an electrically conductive, water-cooled and slot-segmented wall having a continuous, electrically conductive and non-slotted perimeter wall region at an open bottom of the open bottom electric induction cold crucible;
    generating exterior to the electrically conductive, water-cooled and slot-segmented wall a first and a second magnetic flux field from alternating current flowing respectively through an upper induction coil and a lower induction coil surrounding an exterior portion of the electrically conductive, water-cooled and slot-segmented wall with the upper and the lower induction coils arranged adjacent to each other around a portion of the height of the electrically conductive, water-cooled and slot-segmented wall, the upper induction coil and the lower induction coil separated from each other by an inter-coil magnetic shield, and the first and the second magnetic flux fields penetrating into the crucible volume to inductively heat and melt the charge of the pre-ingot material within the crucible volume to form a molten pre-ingot composition within the crucible volume;
    at least partially solidifying the molten pre-ingot composition within the crucible volume to form the ingot at the open bottom of the open bottom electric induction cold crucible; and
    suppressing the first and the second magnetic flux fields from penetration into the electrically conductive, water-cooled and slot-segmented wall adjacent to the continuous, electrically conductive and non-slotted perimeter wall region.

5. The method of claim 4 wherein the step of suppressing the first and the second magnetic flux fields from penetration into the electrically conductive, water-cooled and slot-segmented wall adjacent to the continuous, electrically conductive and non-slotted perimeter wall region further comprises the step of positioning a copper rectangularly-shaped flattened annulus around the outer perimeter of the electrically conductive, water-cooled and slot-segmented wall in a crucible bottom region adjacent to the continuous, electrically conductive and non-slotted perimeter wall region.

6. The method of claim 5 further comprising the step of cooling the copper rectangularly-shaped flattened annulus.

7. The method of claim 4 further comprising the step of enclosing the open bottom electric induction cold crucible in a sealable furnace vessel.

8. The method of claim 4 wherein the step of suppressing the first and the second magnetic flux fields from penetration into the electrically conductive, water-cooled and slot-segmented wall adjacent to the continuous, electrically conductive and non-slotted perimeter wall region further comprises the step of positioning a copper rectangularly-shaped flattened annulus around the outer perimeter of the electrically conductive, water-cooled and slot-segmented wall in a crucible bottom region adjacent to the continuous, electrically conductive and non-slotted perimeter wall region.

9. The method of claim 8 further comprising the step of cooling the copper rectangularly-shaped flattened annulus.

10. A method of electromagnetic casting a silicon ingot in an open bottom electric induction cold crucible, the method comprising the steps of:
supplying a charge of silicon material to a crucible volume formed from an electrically conductive, water-cooled and slot-segmented wall having a continuous, electrically conductive and non-slotted perimeter wall region at an open bottom of the open bottom electric induction cold crucible;
generating a first magnetic flux field and a second magnetic flux field from alternating current flowing respectively through an upper induction coil and the lower induction coil surrounding an exterior portion of the electrically conductive, water-cooled and slot-segmented wall with the upper and the lower induction coils arranged adjacent to each other around a portion of the height of the electrically conductive, water-cooled and slot-segmented wall, the upper induction coil and the lower induction coil separated from each other by an inter-coil magnetic shield, and the first magnetic flux field and the second magnetic flux field penetrating into the crucible volume to inductively heat and melt the charge of the silicon material within the crucible volume to form a molten silicon composition within the crucible volume;
at least partially solidifying the molten silicon composition within the crucible volume to form the silicon ingot at the open bottom of the open bottom electric induction cold crucible; and
suppressing the first magnetic flux field and the second magnetic flux field from penetration into the electrically conductive, water-cooled and slot-segmented wall adjacent to the continuous, electrically conductive and non-slotted perimeter wall region.

11. The method of claim 10 further comprising the step of enclosing the open bottom electric induction cold crucible in a sealable furnace vessel.

12. The method of claim 10 wherein the step of suppressing the first magnetic flux field and the second magnetic flux field from penetration into the electrically conductive, water-cooled and slot-segmented wall adjacent to the continuous, electrically conductive and non-slotted perimeter wall region further comprises the step of positioning a copper rectangularly-shaped flattened annulus around the outer perimeter of the electrically conductive, water-cooled and slot-segmented wall in a crucible bottom region adjacent to the continuous, electrically conductive and non-slotted perimeter wall region.

13. The method of claim 12 further comprising the step of cooling the copper rectangularly-shaped flattened annulus.

* * * * *